(12) United States Patent
Wang et al.

(10) Patent No.: US 9,627,210 B2
(45) Date of Patent: Apr. 18, 2017

(54) METHOD OF FABRICATING ELECTROSTATIC DISCHARGE PROTECTION STRUCTURE

(71) Applicant: UNITED MICROELECTRONICS CORPORATION, Hsinchu (TW)

(72) Inventors: Chang-Tzu Wang, Yangmei (TW); Yu-Chun Chen, Hsinchu County (TW); Tien-Hao Tang, Hsinchu (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 15/159,816

(22) Filed: May 20, 2016

(65) Prior Publication Data

US 2016/0268137 A1    Sep. 15, 2016

Related U.S. Application Data

(62) Division of application No. 13/729,034, filed on Dec. 28, 2012, now Pat. No. 9,378,958.

(51) Int. Cl.
*H01L 21/266* (2006.01)
*H01L 21/265* (2006.01)
(Continued)

(52) U.S. Cl.
CPC .......... *H01L 21/266* (2013.01); *H01L 21/265* (2013.01); *H01L 23/60* (2013.01); *H01L 27/0277* (2013.01); *H01L 2924/0002* (2013.01)

(58) Field of Classification Search
CPC ............. H01L 27/0266; H01L 27/0255; H01L 27/0251; H01L 27/0262; H01L 27/0259;
(Continued)

(56) References Cited

U.S. PATENT DOCUMENTS 6,114,226 A    9/2000  Chang
6,444,511 B1   9/2002  Wu et al.
(Continued)

FOREIGN PATENT DOCUMENTS

EP    1225636    7/2002

OTHER PUBLICATIONS

Definition of the term "adjacent" from The American Heritage Dictionary of the English Language, 2000, date accessed online Jun. 1, 2015, 2 pages.

*Primary Examiner* — Earl Taylor
(74) *Attorney, Agent, or Firm* — Ding Yu Tan

(57) ABSTRACT

A method of fabricating an electrostatic discharge protection structure includes the following steps. Firstly, a semiconductor substrate is provided. Plural isolation structures, a well region, a first conductive region and a second conductive region are formed in the semiconductor substrate. The well region contains first type conducting carriers. The first conductive region and the second conductive region contain second type conducting carriers. Then, a mask layer is formed on the surface of the semiconductor substrate, wherein a part of the first conductive region is exposed. Then, a first implantation process is performed to implant the second type conducting carriers into the well region by using the mask layer as an implantation mask, so that a portion of the first type conducting carriers of the well region is electrically neutralized and a first doped region is formed under the exposed part of the first conductive region.

8 Claims, 6 Drawing Sheets

(51) Int. Cl.
*H01L 23/60* (2006.01)
*H01L 27/02* (2006.01)

(58) Field of Classification Search
CPC . H01L 27/0277; H01L 21/266; H01L 21/265; H01L 23/60
See application file for complete search history.

(56) References Cited

U.S. PATENT DOCUMENTS

| | | |
|---|---|---|
| 6,452,236 B1 | 9/2002 | Nadakumar |
| 6,548,874 B1 | 4/2003 | Morton |
| 6,765,771 B2 | 7/2004 | Ker |
| 6,838,734 B2 | 1/2005 | Ker |
| 6,878,996 B2 | 4/2005 | Rothleitner |
| 6,879,003 B1 | 4/2005 | Cheng |
| 6,882,009 B2 | 4/2005 | Ker |
| 6,956,266 B1 | 10/2005 | Voldman |
| 7,064,407 B1 | 6/2006 | Mallikarjunaswamy |
| 7,135,743 B2 | 11/2006 | Manna et al. |
| 7,253,480 B2 | 8/2007 | Chen et al. |
| 7,288,449 B2 | 10/2007 | Ker |
| 7,326,998 B1 | 2/2008 | O |
| 7,465,995 B2 | 12/2008 | Chu |
| 7,838,924 B2 | 11/2010 | Boselli |
| 7,910,998 B2 | 3/2011 | Hwang |
| 8,080,832 B1 | 12/2011 | Boyd |
| 8,110,853 B2 | 2/2012 | Voldman |
| 8,283,973 B2 | 10/2012 | Hashimoto |
| 8,299,544 B2 | 10/2012 | Abou-Khalil |
| 8,575,691 B2 | 11/2013 | Liu et al. |
| 8,664,723 B1 | 3/2014 | Tseng |
| 2002/0122280 A1 | 9/2002 | Ker et al. |
| 2002/0130390 A1 | 9/2002 | Ker |
| 2003/0168701 A1 | 9/2003 | Voldman |
| 2003/0227053 A1 | 12/2003 | Nomura |
| 2004/0043568 A1 | 3/2004 | Ker et al. |
| 2004/0190209 A1 | 9/2004 | Jozwiak et al. |
| 2005/0042815 A1 | 2/2005 | Williams |
| 2005/0045956 A1 | 3/2005 | Chen et al. |
| 2005/0133868 A1 | 6/2005 | Su |
| 2005/0275032 A1 | 12/2005 | Kodama |
| 2006/0113600 A1 | 6/2006 | Salling |
| 2007/0004160 A1 | 1/2007 | Voldman |
| 2007/0210387 A1 | 9/2007 | Russ |
| 2008/0191277 A1 | 8/2008 | Disney et al. |
| 2008/0237706 A1 | 10/2008 | Williams |
| 2010/0019318 A1 | 1/2010 | Chao |
| 2010/0032758 A1 | 2/2010 | Wang |
| 2010/0193869 A1 | 8/2010 | Habasaki |
| 2011/0101444 A1 | 5/2011 | Coyne |
| 2011/0260254 A1 | 10/2011 | Kim |
| 2012/0139013 A1 | 6/2012 | Bshl |
| 2012/0161235 A1 | 6/2012 | Huang |
| 2012/0161236 A1 | 6/2012 | Huang |
| 2012/0168878 A1 | 7/2012 | Abou-Khalil et al. |
| 2012/0199878 A1 | 8/2012 | Shrivastava |
| 2012/0205744 A1 | 8/2012 | O |
| 2012/0313175 A1 | 12/2012 | Wang |
| 2013/0093009 A1 | 4/2013 | Chen |
| 2013/0105904 A1 | 5/2013 | Roybal |
| 2013/0207184 A1 | 8/2013 | Chen |
| 2013/0208379 A1 | 8/2013 | Wang |
| 2014/0070361 A1 | 3/2014 | Benaissa |
| 2014/0183596 A1 | 7/2014 | Wang |
| 2014/0183708 A1 | 7/2014 | Wang |

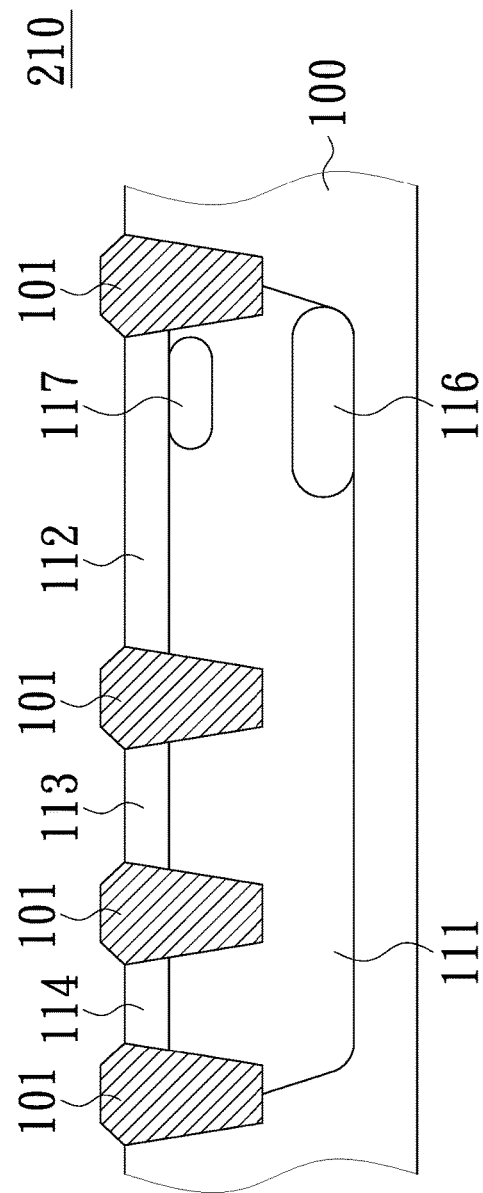
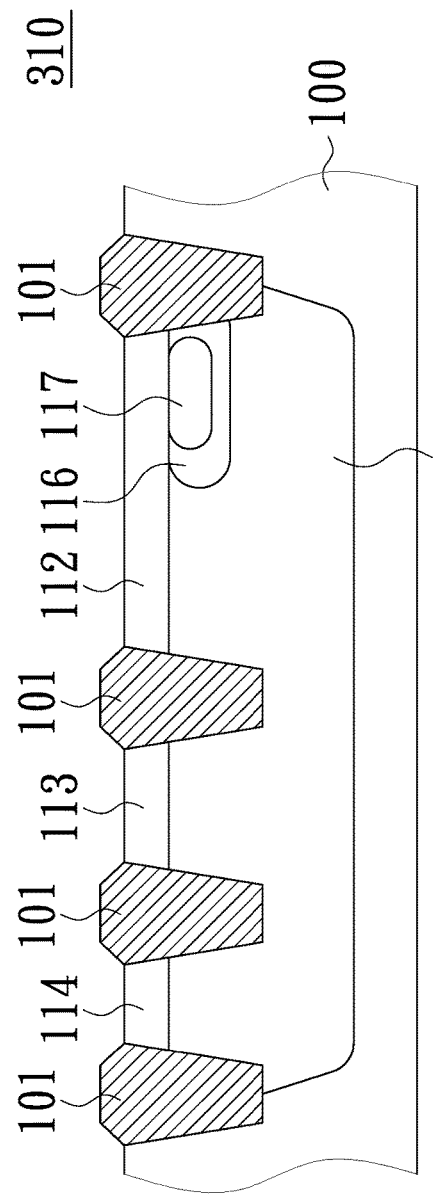
FIG. 2
FIG. 3

METHOD OF FABRICATING ELECTROSTATIC DISCHARGE PROTECTION STRUCTURE

CROSS REFERENCE TO RELATED PATENT APPLICATIONS

This divisional application claims the benefit of U.S. patent application Ser. No. 13/729,034, filed Dec. 28, 2012 currently pending, and is incorporated by reference herein in its entirety.

FIELD OF THE INVENTION

The present invention relates to a semiconductor structure and a fabricating method thereof, and more particularly to an electrostatic discharge protection structure and a fabricating method thereof.

BACKGROUND OF THE INVENTION

In the process of producing or using a semiconductor device, electrostatic discharge (ESD) may result in sudden flow of electricity. The sudden flow of electricity may cause damage to the semiconductor device or the functional circuit, and reduce the production efficiency and the product yield.

In the deep sub-micron and nano-scale process, the size of the semiconductor device is gradually decreased, and the ESD tolerance is deteriorated. Consequently, it is necessary to increase the ESD protection capability. Conventionally, many ESD protection structures are disclosed to achieve ESD protection. However, the performance of the semiconductor device or the functional circuit to be protected may be impaired by these ESD protection structures.

Therefore, there is a need of providing an improved electrostatic discharge protection structure with good ESD protection capability while maintaining the performance of the semiconductor device or the functional circuit.

SUMMARY OF THE INVENTION

In accordance with an aspect, the present invention provides a method of fabricating an electrostatic discharge protection structure. Firstly, a semiconductor substrate is provided. Plural isolation structures, a well region, a first conductive region and a second conductive region are formed in the semiconductor substrate. The well region contains first type conducting carriers. The first conductive region and the second conductive region contain second type conducting carriers. The well region is arranged between the plural isolation structures. The first conductive region and the second conductive region are formed in a surface of the semiconductor substrate over the well region. Then, a mask layer is formed on the surface of the semiconductor substrate, wherein a part of the first conductive region is exposed. Then, a first implantation process is performed to implant the second type conducting carriers into the well region by using the mask layer as an implantation mask, so that a portion of the first type conducting carriers of the well region is electrically neutralized and a first doped region is formed under the exposed part of the first conductive region.

In accordance with another aspect, the present invention provides an electrostatic discharge protection structure. The electrostatic discharge protection structure includes a semiconductor substrate, a well region, a first conductive region, a second conductive region, and a first doped region. Plural isolation structures are formed in the semiconductor substrate. The well region is formed in the semiconductor substrate, and arranged between the plural isolation structures. The well region contains first type conducting carriers. The first conductive region and the second conductive region are formed in a surface of the semiconductor substrate over the well region. The first conductive region and the second conductive region contain second type conducting carriers. The first doped region is disposed under the first conductive region.

In accordance with the present invention, a high resistance region is formed in the electrostatic discharge protection structure. Consequently, the breakdown voltage of the electrostatic discharge protection structure and the path of the ESD current flowing through the electrostatic discharge protection structure are adjustable. In other words, the electrostatic discharge protection structure of the present invention is capable of protecting the semiconductor device and enhancing the device performance.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 2 is a schematic cross-sectional view illustrating an electrostatic discharge protection structure according to another embodiment of the present invention; and FIG. 3 is a schematic cross-sectional view illustrating an electrostatic discharge protection structure according to a further embodiment of the present invention.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

FIGS. 1A~1E are schematic cross-sectional views illustrating a partial process flow of a method of fabricating an electrostatic discharge protection structure according to an embodiment of the present invention.

Figure 1A:
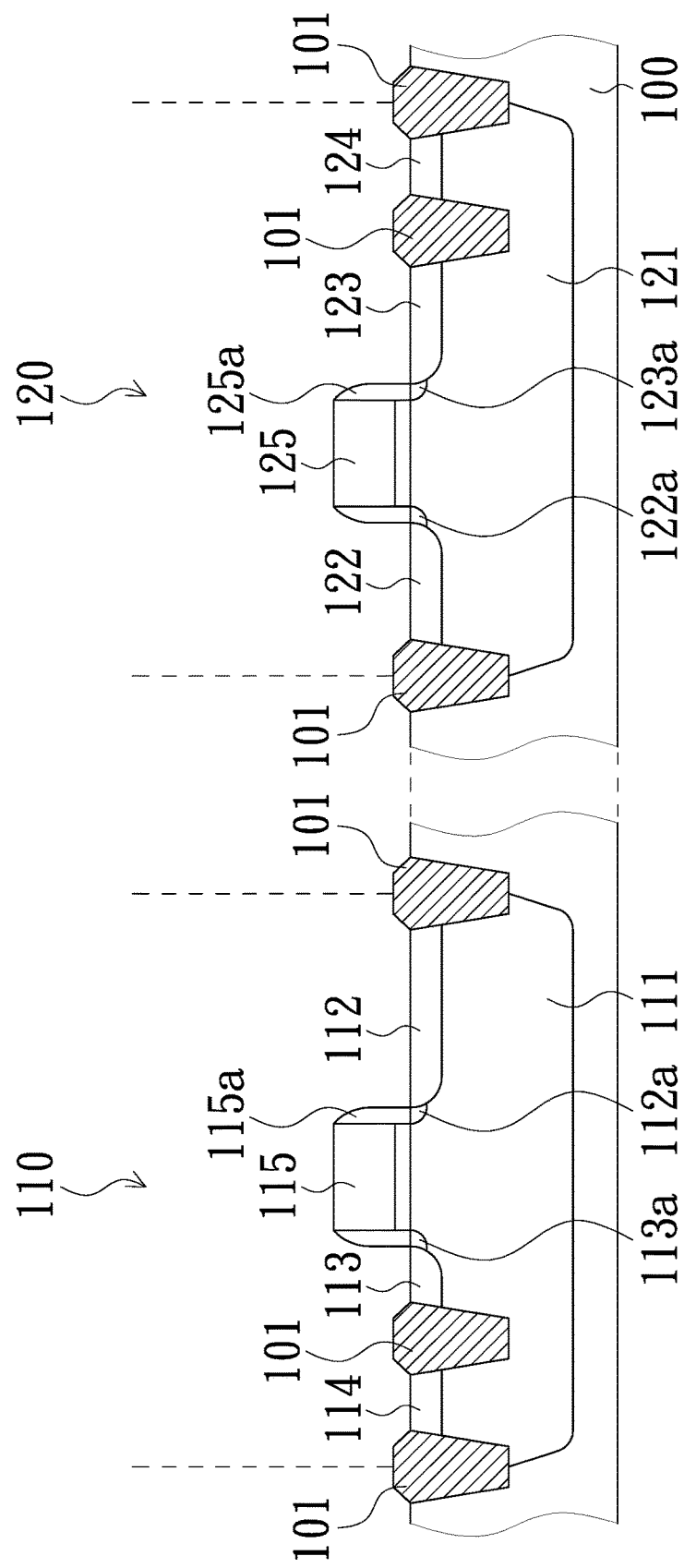
FIGS. 1A~1E are schematic cross-sectional views illustrating a partial process flow of a method of fabricating an electrostatic discharge protection structure according to an embodiment of the present invention.

Firstly, as shown in FIG. 1A, a semiconductor substrate 100 with a plurality of isolation structures 101 is provided. Some of the isolation structures 101 are used to define an electrostatic discharge protection structure 110 and a device region 120. A well region (111, 121), a first conductive region (112, 122) and a second conductive region (113, 123) are formed in the semiconductor substrate 100 corresponding to the electrostatic discharge protection structure 110 and the device region 120. The well region (111, 121) contains first type conducting carriers. The first conductive region (112, 122) and the second conductive region (113, 123) contain second type conducting carriers. The well region (111, 121) is arranged between these isolation structures 101. The first conductive region (112, 122) and the second conductive region (113, 123) are formed in a surface of the semiconductor substrate 100 over the well region (111, 121).

The concentration of the second type conducting carriers of the first conductive region (112, 122) and the second conductive region (113, 123) is higher than the concentration of the first type conducting carriers of the well region (111, 121).

In this embodiment, the semiconductor substrate 100 is a silicon substrate, and is also doped with the first type conducting carriers. The process of forming the electrostatic discharge protection structure 110 may be integrated into the process of forming the device region 120, for example a MOS process, a CMOS process or a Bi-CMOS process. For example, after multiple implantation processes are performed to implant the first type conducting carriers into the semiconductor substrate 100 corresponding to the electrostatic discharge protection structure 110 and the device region 120, the well region (111, 121) with the first type conducting carriers are formed. After a first gate structure 115 and a second gate structure 125 are formed on the surface of the semiconductor substrate 100, a mask layer (not shown) is partially formed on the surface of the semiconductor substrate 100 corresponding to the electrostatic discharge protection structure 110 and the device region 120. Then, an implantation process is performed to implant the second type conducting carriers into the exposed parts of the electrostatic discharge protection structure 110 and the device region 120, wherein the concentration of the second type conducting carriers is higher than the concentration of the first type conducting carriers of the well region (111, 121). Consequently, plural lightly doped drain (LDD) regions with the second type conducting carriers are formed. Then, two sidewalls 115a and 125a are formed on the first gate structure 115 and the second gate structure 125, respectively. Then, a mask layer (not shown) is partially formed on the surface of the semiconductor substrate 100 while exposing a part of the surfaces of the lightly doped drain regions. Then, an implantation process is performed to implant the second type conducting carriers into the exposed parts of the semiconductor substrate 100, wherein the concentration of the second type conducting carriers of the exposed parts of the semiconductor substrate 100 is higher than that of the lightly doped drain regions. Consequently, the first conductive region (112, 122) and the second conductive region (113, 123) with the higher concentration of the second type conducting carriers and a plurality of lightly doped drain (LDD) regions 112a, 122a, 113a and 123a with the lower concentration of the second type conducting carriers are formed. Then, a mask layer (not shown) is partially formed over the first conductive region (112, 122), the second conductive region (113, 123), the gate structures 115 and 125 and the sidewalls 115a and 125a, while exposing a part of the semiconductor substrate 100 corresponding to the electrostatic discharge protection structure 110 and the device region 120. Then, an implantation process is performed to implant the first type conducting carriers into the exposed parts of the semiconductor substrate 100 to increase the concentration of the first type conducting carriers in parts of the well region (111, 121). Consequently, a third conductive region (114, 124) with the higher concentration of the first type conducting carriers is formed.

For clarification and brevity, only the cross-sectional view of the electrostatic discharge protection structure 110 will be shown in FIGS. 1B~1E.

Figure 1B:
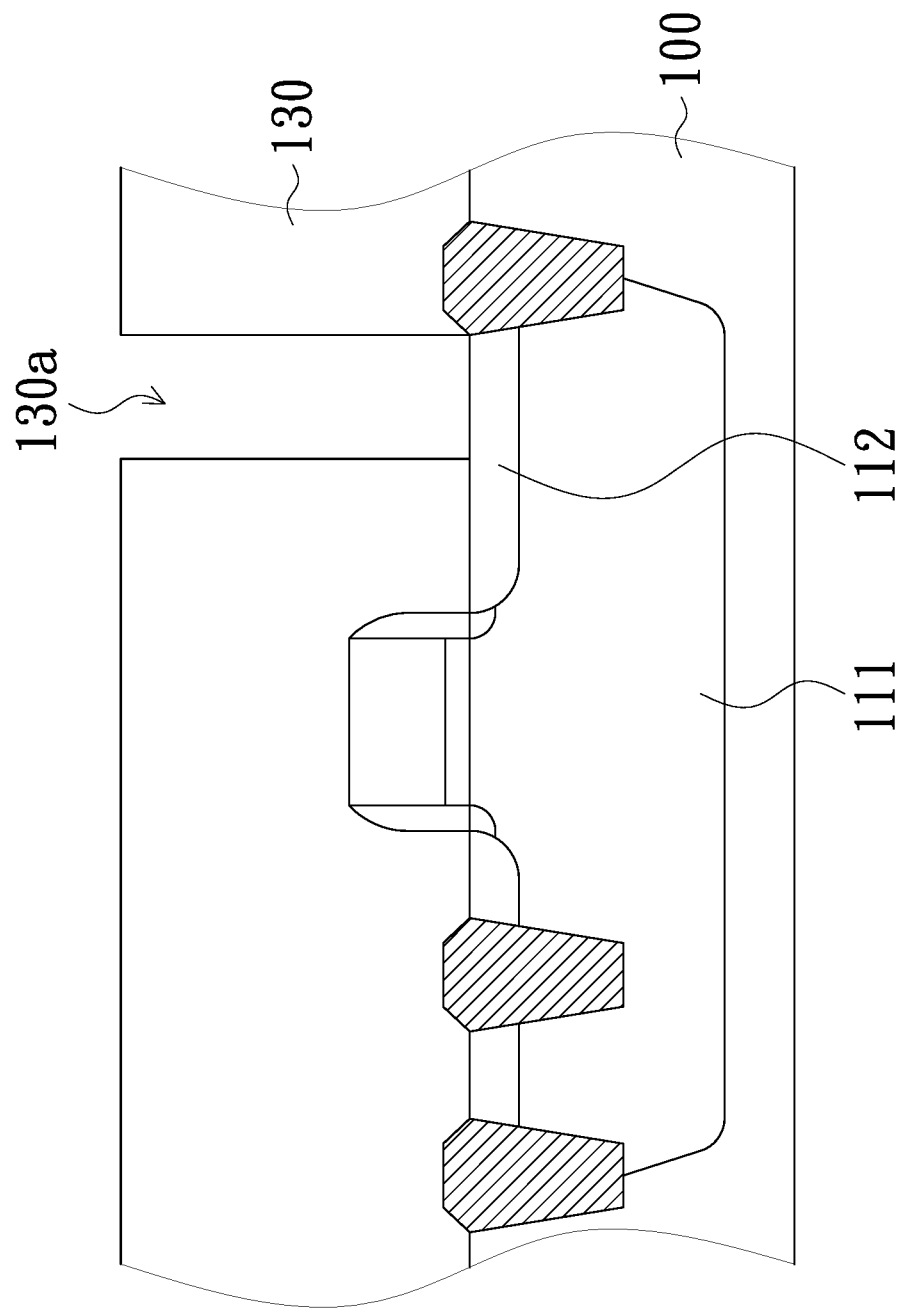

Then, as shown in FIG. 1B, a mask layer 130 is formed on the surface of the semiconductor substrate 100. A part of the first conductive region 112 is exposed through an opening 130a of the mask layer 130. By using the mask layer 130 as an implantation mask, a first implantation process is performed to implant the second type conducting carriers to electrically neutralize a portion of the first type conducting carriers of the well region 111. In this embodiment, the first type conducting carriers are P type carriers (e.g. hole carriers), and the second type conducting carriers are N type carriers (e.g. electron carriers). By performing the first implantation process, the N type carriers such as phosphorus atoms (P) or arsenic atoms (As) are implanted into the well region 111 (i.e. a P well) to neutralize the portion of the first type conducting carriers. Consequently, the concentration of the first type conducting carriers of the well region 111 is reduced. Alternatively, in some other embodiments, the first type conducting carriers are N type carriers (e.g. electron carriers), and the second type conducting carriers are P type carriers (e.g. hole carriers). By performing the first implantation process, the P type carriers such as boron atoms (B) or gallium atoms (Ga) are implanted into the well region 111 (i.e. an N well) to neutralize the portion of the first type conducting carriers. In accordance with the present invention, the carrier types of the first type conducting carriers and the second type conducting carriers are not restricted.

Figure 1C:
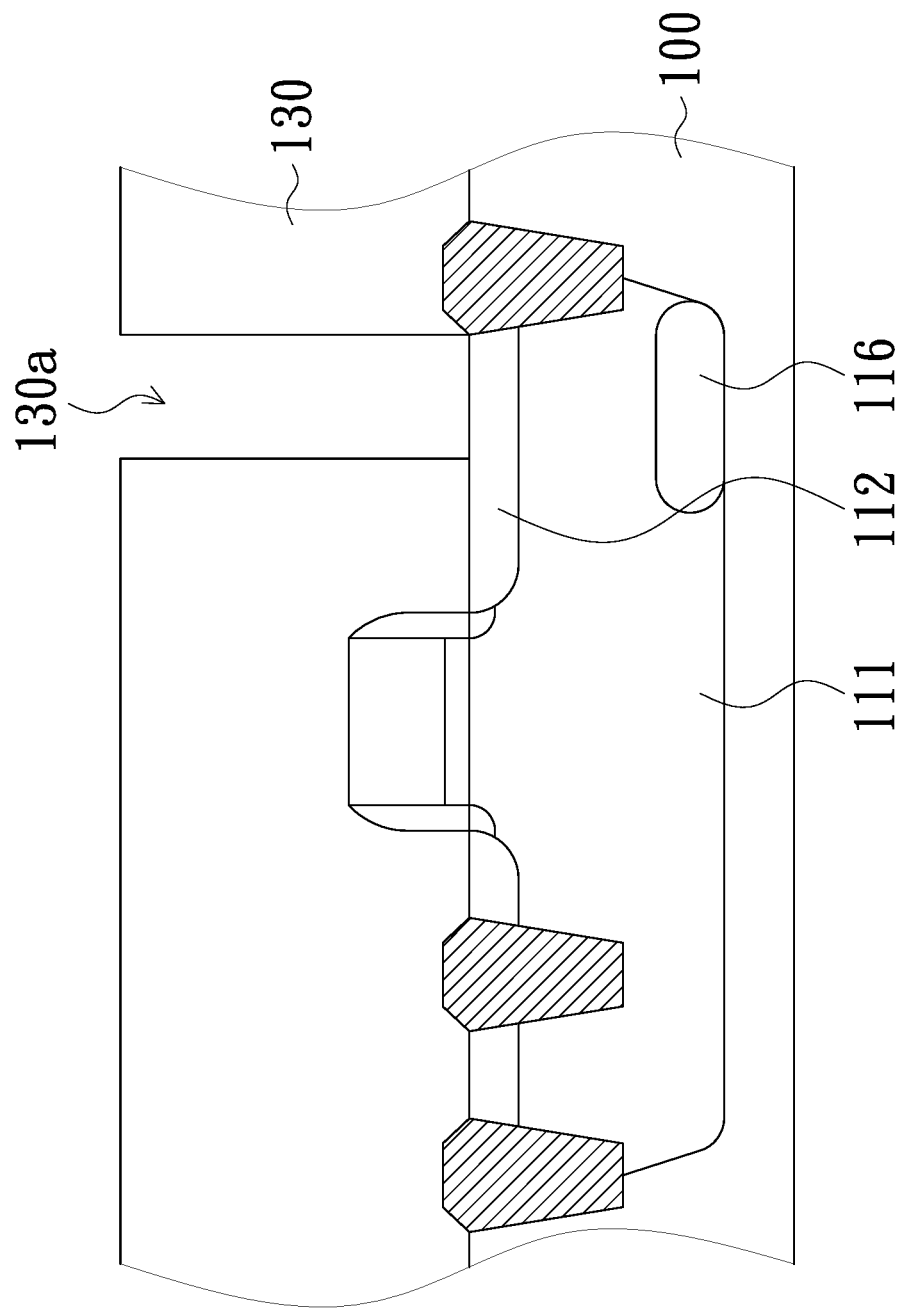

After the first implantation process is completed, as shown in FIG. 1C, a first doped region 116 is formed under the exposed part of the first conductive region 112 (N+). The first doped region 116 is separated from the first conductive region 112 by the unneutralized P well region 111. In particular, the type, the concentration or the implantation range of the first doped region 116 may be controlled by adjusting the process parameters of the first implantation process. For example, the process parameters include the dopant concentration, the implantation duration, the implantation angle, the implantation energy, the annealing diffusion, and so on. In this embodiment, after a portion of the hole carriers of the P well region 111 are electrically neutralized by the first implantation process, the first doped region 116 is a low-concentration electron carrier region (N−). Alternatively, in some other embodiments, the first doped region 116 may be an electrically-neutral region or a low-concentration hole carrier region (P−). Since the concentration of the conducting carriers of the first doped region 116 is lower than the concentration of the conducting carriers of the P well region 111, the first doped region 116 may be considered as a high resistance region. Under this circumstance, if an ESD current is generated at the electrostatic discharge protection structure 110, the path of the ESD current is adjusted according to the resistance profile of the electrostatic discharge protection structure 110.

Figure 1D:
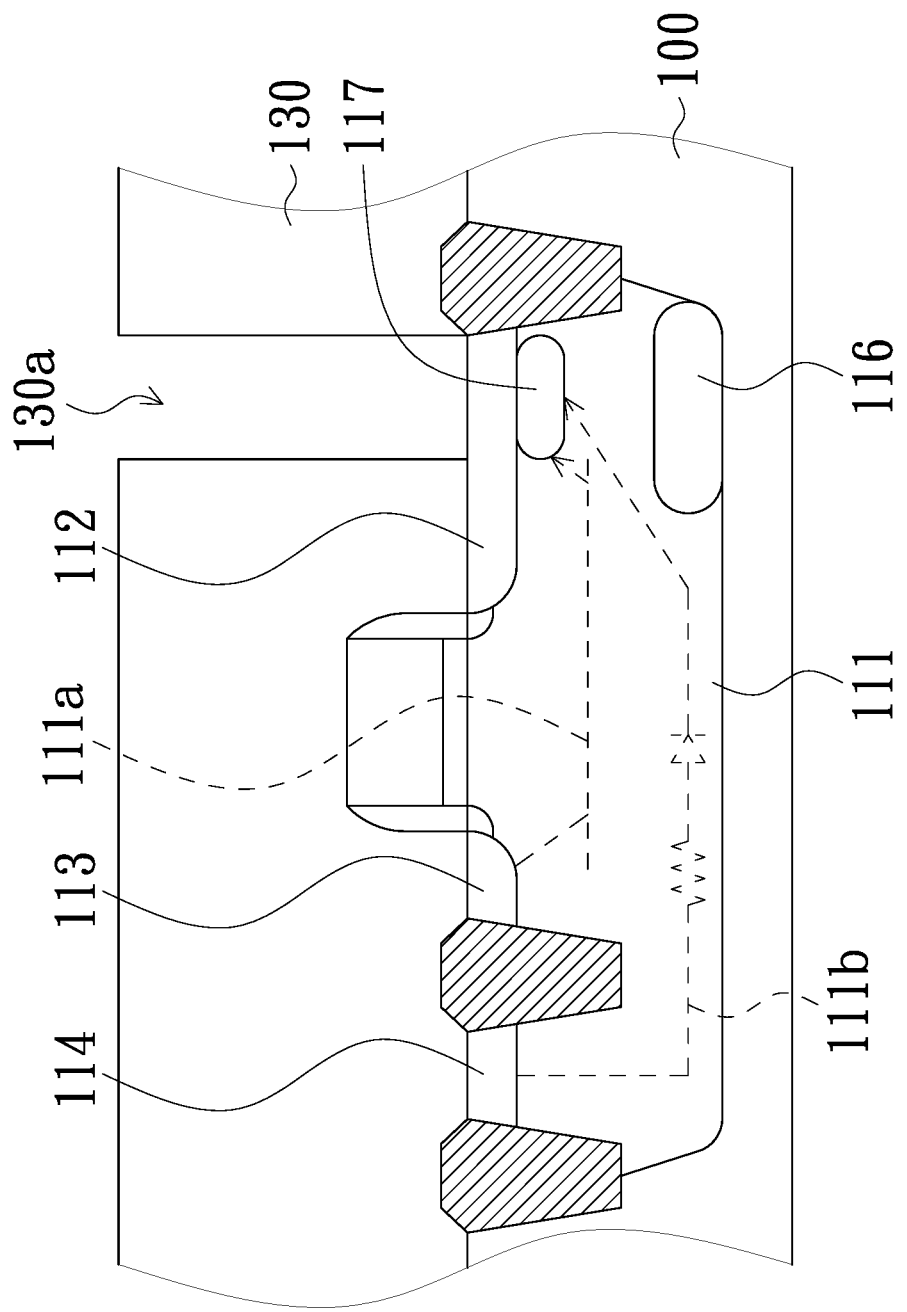

Optionally, by using the same mask layer 130 as an implantation mask, a second implantation process is performed to increase the concentration of the first type conducting carriers of the unneutralized well region 111. Consequently, a second doped region 117 is formed between the exposed part of the first conductive region 112 and the first doped region 116. Under this circumstance, the first conductive region 112, the well region 111 and the second conductive region 113 collaboratively define a parasitic bipolar junction transistor 111a (also referred as a parasitic BJT). In addition, the first conductive region 112, the well region 111 and the third conductive region 114 collaboratively define a parasitic diode with a serially-connected resistor 111b, which is indicated by a dotted circuit symbol. In this embodiment, the parasitic bipolar junction transistor is an NPN BJT. After the second implantation process is performed, the P type carriers are implanted into the unneutralized P well region 111. Consequently, the concentration of the hole carriers in a part of the unneutralized P well region 111 is increased. As shown in FIG. 1D, the second doped region 117 (P+) is contacted with a bottom of the first conductive region 112 (N+). Under this circumstance, a high-concentration PN junction is formed between the second doped region 117 (P+) and the first conductive region 112 (N+) to effectively reduce the breakdown voltage of the bipolar junction transistor.

Figure 1E:
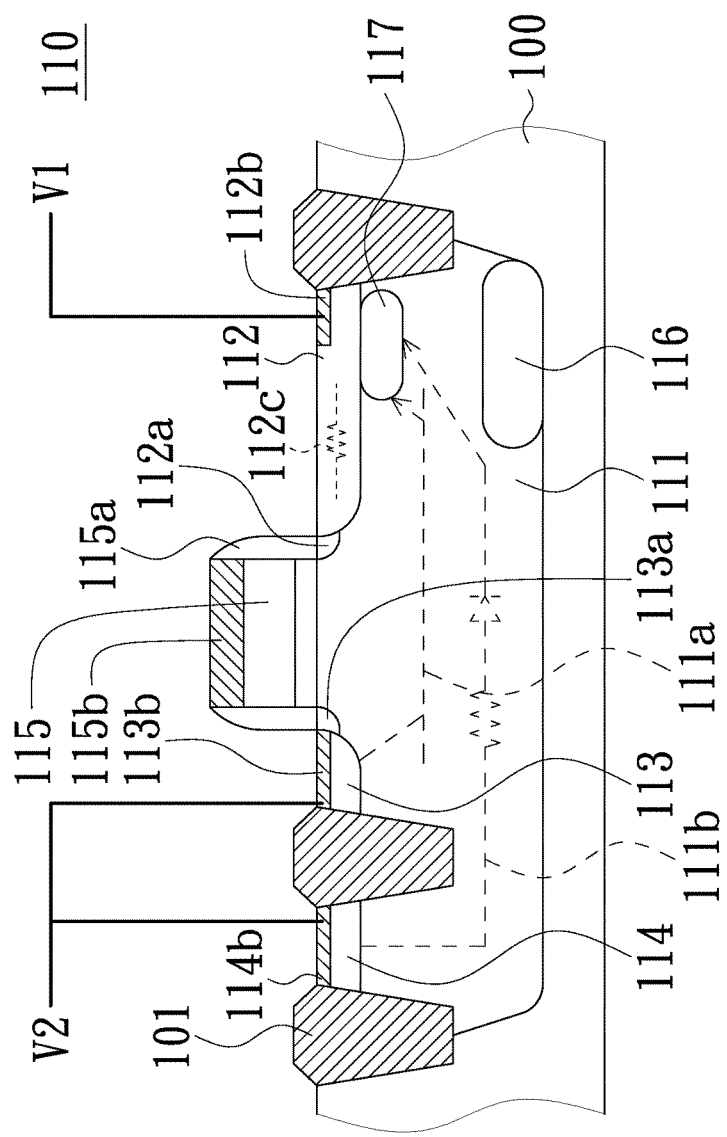

Then, as shown in FIG. 1E, the mask layer 130 is removed. Then, the electrostatic discharge protection structure 110 and the device region 120 are subjected to a salicide process simultaneously. Consequently, a plurality of salicide layers 112b, 113b, 114b and 115b are formed in the first conductive region 112, the second conductive region 113, the third conductive region 114 and the gate structure 115, respectively. These salicide layers 112b, 113b, 114b and 115b may be used as the contact regions of the interconnection structures of the semiconductor device. In this embodiment, the length of the salicide layer 112b may be adjusted according to the practical requirements. For example, a salicide blocking process may be optionally performed to change the length of the salicide layer 112b, thereby adjusting the resistance value of the first conductive region 112. As shown in FIG. 1E, a resistor 112c in the first conductive region 112 is indicated by a dotted circuit symbol.

After the resulting structure of FIG. 1E is produced, the interconnection structures of the semiconductor device are sequentially formed. For example, the first conductive region 112 (N+) is electrically connected to a drain voltage V1, and the second conductive region 113 (N+) and the third conductive region 114 (P+) are electrically connected to a ground voltage V2. After the process of forming the interconnection structures of the semiconductor device is completed, if an ESD current is generated, the ESD current can be quickly transmitted to ground through the paths of the parasitic BJT 111a and the parasitic diode with a serially-connected resistor 111b of the electrostatic discharge protection structure 110. Under this circumstance, since the energy from the ESD current is uniformly released, the possibility of causing damage of the electrostatic discharge protection structure 110 and the device region 120 will be largely reduced. In a case that the signals are normally outputted or inputted, the electrostatic discharge protection structure 110 is in an off state. Since the electrostatic discharge protection structure 110 comprises the high-resistance first doped region 116, the electrostatic discharge protection structure 110 is not in the on state to generate a leakage current.

FIG. 2 is a schematic cross-sectional view illustrating an electrostatic discharge protection structure according to another embodiment of the present invention. In this embodiment, the electrostatic discharge protection structure 210 has a bipolar junction transistor (BJT) configuration. Similarly, the process of forming the electrostatic discharge protection structure 210 may be integrated into the process of forming the device region (not shown). In comparison with the electrostatic discharge protection structure 110 of the first embodiment, no gate structure and no LDD region are formed in the electrostatic discharge protection structure 210 of the another embodiment. Moreover, the first conductive region 112 and the second conductive region 113 are separated from each other by an isolation structure 101.

FIG. 3 is a schematic cross-sectional view illustrating an electrostatic discharge protection structure according to a further embodiment of the present invention. In this embodiment, the electrostatic discharge protection structure 310 has a silicon controller rectifier (SCR) configuration. Similar to that shown in FIG. 2, the first conductive region 112 and the second conductive region 113 of the electrostatic discharge protection structure 310 are separated from each other by an isolation structure 101. In comparison with the electrostatic discharge protection structure 210 of the another embodiment, the second doped region 117 of the electrostatic discharge protection structure 310 is contacted with the first conductive region 112 and the first doped region 116. The second doped region 117 is enclosed by the first doped region 116. Consequently, two PN junctions are formed between the first conductive region 112, the second doped region 117 and the first doped region 116. The first conductive region 112, the second doped region 117, the first doped region 116 and the third conductive region 114 collaboratively define the silicon controller rectifier (SCR). Under this further embodiment, if an ESD current is generated, the ESD current can be quickly transmitted to ground through the path of the silicon controller rectifier.

From the above descriptions, the present invention provides an electrostatic discharge protection structure and a fabricating method thereof. Since the process of forming the electrostatic discharge protection structure may be integrated into the process of forming the device region, the fabricating cost is reduced. Moreover, by using a single mask layer as an implantation mask, an implantation process is performed to form a high resistance region in the electrostatic discharge protection structure. Consequently, the breakdown voltage of the electrostatic discharge protection structure and the path of the ESD current flowing through the electrostatic discharge protection structure are adjustable. Consequently, the ESD current can be quickly transmitted to ground. In other words, the electrostatic discharge protection structure of the present invention is capable of protecting the semiconductor device and enhancing the device performance.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of fabricating an electrostatic discharge protection structure, the method comprising steps of:

providing a semiconductor substrate, wherein a plurality of isolation structures, a well region, a first conductive region and a second conductive region are formed in the semiconductor substrate, wherein the well region contains a plurality of first type conducting carriers, and the first conductive region and the second conductive region contain a plurality of second type conducting carriers, wherein the well region is arranged between the plurality of isolation structures, and the first conductive region and the second conductive region are formed in a surface of the semiconductor substrate over the well region;

forming a mask layer on the surface of the semiconductor substrate, wherein a part of the first conductive region is exposed; and performing a first implantation process to implant the second type conducting carriers into the well region by using the mask layer as an implantation mask, so that a portion of the first type conducting carriers of the well region is electrically neutralized and a first doped region is formed under the exposed part of the first conductive region, wherein the first doped region is separated from the first conductive region by an unneutralized well region, which is a portion of the well region where the first type conducting carriers are not neutralized by the first implantation process.

2. The method according to claim 1, wherein the first type conducting carriers are holes, and the second type conducting carriers are electrons.

3. The method according to claim 1, wherein the first doped region contains the first type conducting carriers, wherein a concentration of the first type conducting carriers of the first doped region is lower than a concentration of the first type conducting carriers of the unneutralized well region.

4. The method according to claim 1, wherein the first doped region contains the second type conducting carriers, wherein a concentration of the second type conducting carriers of the first doped region is lower than a concentration of the first type conducting carriers of the unneutralized well region.

5. The method according to claim 1, further comprising a step of performing a second implantation process to implant the first type conducting carriers into a part of the unneutralized well region by using the mask layer as an implantation mask, so that a second doped region is formed between the exposed part of the first conductive region and the first doped region.

6. The method according to claim 5, wherein a concentration of the first type conducting carriers of the second doped region is higher than a concentration of the first type conducting carriers of the remaining part of the unneutralized well region.

7. The method according to claim 5, wherein the second doped region is contacted with a bottom of the first conductive region.

8. The method according to claim 7, wherein the first doped region and the second doped region are separated from each other by the remaining part of the unneutralized well region.

* * * * *